US009829953B2

(12) United States Patent
Reade et al.

(10) Patent No.: US 9,829,953 B2
(45) Date of Patent: Nov. 28, 2017

(54) CHARGING APPARATUS AND PORTABLE POWER SUPPLY

(71) Applicant: ARK Corporation Pty Ltd, Arndell Park (AU)

(72) Inventors: Andrew Reade, Arndell Park (AU); Richard Arakelian, Arndell Park (AU)

(73) Assignee: ARK Corporation Pty Ltd (AU)

( * ) Notice: Subject to any disclaimer, the term of this patent is extended or adjusted under 35 U.S.C. 154(b) by 0 days.

(21) Appl. No.: 14/831,710

(22) Filed: Aug. 20, 2015

(65) Prior Publication Data

US 2015/0355702 A1 Dec. 10, 2015

Related U.S. Application Data

(63) Continuation of application No. 13/192,245, filed on Jul. 27, 2011, now Pat. No. 9,153,978.

(30) Foreign Application Priority Data

Jul. 27, 2010 (AU) ................................ 2010903353

(51) Int. Cl.
*H02J 7/00* (2006.01)
*G06F 1/32* (2006.01)
*G06F 11/32* (2006.01)
*H05K 5/02* (2006.01)
*H02J 7/02* (2016.01)

(52) U.S. Cl.
CPC .......... *G06F 1/3212* (2013.01); *G06F 11/327* (2013.01); *H02J 7/0042* (2013.01); *H02J 7/0047* (2013.01); *H05K 5/023* (2013.01); *H02J 7/027* (2013.01); *H02J 2007/005* (2013.01)

(58) Field of Classification Search
CPC ........ H01M 10/44; H02J 7/0093; Y02E 60/12
USPC ......................................................... 320/128
See application file for complete search history.

(56) References Cited

U.S. PATENT DOCUMENTS

| | | | |
|---|---|---|---|
| 5,780,992 A | 7/1998 | Beard | |
| 8,450,970 B1* | 5/2013 | Drinkwater | ........... H02J 7/0044 320/107 |
| 2001/0045813 A1* | 11/2001 | Suzuki | ................. H02J 7/0052 320/110 |
| 2004/0257089 A1* | 12/2004 | Aridome | ............. H01M 10/486 324/430 |
| 2005/0156564 A1 | 7/2005 | Krieger | |
| 2006/0006838 A1 | 1/2006 | Clarke | |
| 2007/0024236 A1* | 2/2007 | Arakelian | ........... H01M 2/1072 320/107 |
| 2007/0273325 A1* | 11/2007 | Krieger | ............... H01M 2/1027 320/106 |
| 2007/0285049 A1 | 12/2007 | Krieger | |
| 2008/0084183 A1* | 4/2008 | Hoffman | ............... H02J 7/0042 320/116 |

* cited by examiner

*Primary Examiner* — Arun Williams
(74) *Attorney, Agent, or Firm* — Shaukat A. Karjeker; Carstens & Cahoon, LLP

(57) ABSTRACT

A portable battery box is described. The portable battery box is suitable for charging and housing a battery and comprises: a housing having a lid, a battery removably disposed within the housing, an inverter, a computer processing system, and a display screen. The computer processing system is configured to be powered by the battery and used for receiving measured charge parameters of the battery and estimating other battery parameters.

18 Claims, 11 Drawing Sheets

CHARGING APPARATUS AND PORTABLE POWER SUPPLY

CROSS-REFERENCE TO RELATED APPLICATIONS

This application is a continuation application of, and claims priority to, nonprovisional U.S. patent application Ser. No. 13/192,245, filed Jul. 27, 2011, which claims priority to Australia patent Application No. 2010903353, filed Jul. 27, 2010, which are all hereby incorporated by reference in their entirety as examples.

FIELD OF THE INVENTION

The present invention relates generally to portable battery boxes suitable for housing and charging batteries. In certain applications, lead acid batteries are housed in the portable battery boxes. Aspects of the present invention relate generally to methods of monitoring and controlling the charging and discharging of batteries within portable battery boxes, as well as associated software, hardware, data processing apparatus, computer readable memories and computer program elements for charging and discharging the batteries within those boxes.

BACKGROUND TO THE INVENTION

Portable battery boxes which are suitable for deployment of electrical power in convenient forms and in remote locations are known. In those known portable battery boxes, batteries are disposed in housings for the protection of the batteries and recharged in those housings. The advantages of the battery boxes include that the boxes protect the batteries themselves, componentry associated with charging and discharging, and that the housings facilitate ease of handling and reduce potential for injury to users.

However, monitoring the recharging of the batteries disposed in the battery boxes is inflexible and difficult in known models of portable battery box, in that there is little useful information about the charging process indicated. Furthermore, in some known devices, the charging is ineffective. There may be several reasons for these difficulties. First, a charging method applied to some types of batteries is not always effective for other types of batteries, depending on the chemical composition of the battery and other factors, and if the battery in the box is changed to a different type, the charging may be ineffective. In addition, in some box designs, access to the battery terminals is inhibited by some structural member or, on the other hand, the terminals are not adequately protected, and thus exposed to users which is dangerous.

Also, the batteries are heavy and lifting known battery boxes by their lids can cause deformation of selected areas of the box, which can cause the release of connecting cleats and clips and the like, which may release the battery from the box or release corrosive fluid from the battery into surrounding areas or worse, onto users.

Known battery boxes also include limitations and in controls and monitoring devices.

The present inventors have developed an improved charging apparatus in the form of a battery box, which may ameliorate one or more of any abovementioned disadvantages.

DISCLOSURE OF INVENTION

According to a first aspect of the present invention there is provided a portable battery box suitable for charging and housing a battery, the portable battery box comprising:

a charging apparatus for charging a battery;

a main body for housing a battery, the main body including a base wall, a top wall and at least one side wall extending between the base and top walls; and at least one handle disposed in a respective one of the side walls of the main body.

Preferably the main body includes a covering lid which comprises a top wall and a downwardly-depending skirt, the arrangement being such that the downwardly-depending skirt extends to form a hollow lid shell having a rim at an opening of the hollow lid shell to form a lid chamber. Similarly, a hollow base shell is provided, so that a base chamber is provided having a rim, the chamber being adapted to house a battery. The lid and base shells may be roughly equal in size, and preferably the lid shell is about ⅓ the size of the base shell.

When assembled together the rims of the shells are operatively connected together so that the hollow lid shell hinges to open, the hinge being mounted on one wall and at an opposite wall they are fastened together with a clasp to close the main body.

Preferably the at least one handle is disposed in the hollow base shell side wall, so that a lifting force is transmitted through the side wall of the base shell when the battery box is being lifted by the at least one handle. This obviates a separation force which would be experienced at the clasp if the handle were in the lid.

Preferably two handles are provided, and each handle of the two is disposed in end wall portions of the base shell side wall. Preferably the or each handle includes a surface which corresponds generally to a user's finger which in use is inserted into the side wall and disposed at a slight angle to the wall. The surface is thus arranged to include a base ramp angled upward and inward and a radiused head portion at an upper end of the ramp to receive an end of a finger and to thus provide finger support.

Preferably the handles include apertures to allow cooling air from outside the box into the hollow base shell and hollow lid shell. Preferably the apertures are disposed in the radiused head portion of the handle so that water will be inhibited from flowing through the apertures.

Preferably the ramp and radiused head portion of the or each handle are inset or recessed into the end walls so that an external wall of the handle is substantially or generally flush with the end wall.

Preferably the covering lid is detachable from the main body. Preferably the covering lid is stackable within other covering lids to reduce volume in transportation. Preferably the main body is also stackable within other main bodies to reduce volume in transportation. Preferably the side walls of the hollow shells taper outwards slightly towards their respective rims to facilitate stacking.

In a second aspect, the present invention provides a portable battery box suitable for housing and recharging a battery when installed, the battery box comprising:

a main body for housing a battery, the main body including a base wall, a top wall and at least one side wall extending between the base and top walls;

a charging apparatus for charging a battery;

one or more electrical access ports suitable for control of and/or monitoring of and/or supply or discharge of electrical power to the battery, the or each electrical access port mounted adjacent one or more of the side, base or top walls so that they are recessed therefrom; and one or more access covers, each access cover for covering a respective electrical access port so that by actuating the or each access cover the electrical access ports may be accessed and wherein the cover is generally flush with the side, base and/or top wall.

Preferably the or each electrical access port is mounted in one or more recesses set in from its respective side, base or top wall. In a preferred embodiment the or each access cover is a closure suitable to close the one or more recesses. Preferably there are several recesses and several access covers. Further preferably the or each access cover includes a seal to seal the recess so as to inhibit water ingress to the electrical access ports. In some arrangements the seal is disposed on a perimeter of the recess associated with the wall.

Preferably the main body includes a covering lid which comprises a top wall and a downwardly-depending skirt, the arrangement being such that the downwardly-depending skirt extends to form a hollow lid shell having a rim at an opening of the hollow lid shell to form a lid chamber. Similarly, a hollow base shell is formed, so that a base chamber is provided having a rim, the chamber being adapted to house a battery. The lid and base shells may be roughly equal in size, and preferably the lid shell is about ⅓ the size of the base shell. When assembled together the rims of the shells are hinged along one wall and at an opposite wall they are fastened together with a clasp to close the main body.

Preferably the electrical access ports are selected from the group consisting of: an LCD display; a plurality of user input/output keys; a mouse or trackball; an isolation switch; a USB port; a 6, 12 or 24V DC cigarette lighter/alternative power source slot; a 110V/60 Hz or 240V/50 Hz General Power Outlet; a 50 A Anderson plug slot; and a plurality of 6, 12, 24V battery posts.

Preferably the or each access cover extends over a portion of the top wall to a portion of an adjacent side wall so that the or each access cover is in the form of a gullwing-like shell. Preferably the access covers are hinged. Preferably the hinge is disposed on the top wall end of the access cover.

Preferably a lip or tab which extends from a portion of the access cover is provided to facilitate operation of the access cover. In a preferred embodiment the lip is on the opposite end of the access cover to that on which the hinge is mounted.

The or each access cover may include a window or may be wholly transparent so as to allow viewing of the control and/or monitoring and/or outlet devices without opening the or each access cover.

In use battery is provided in the main body and in use is disposed within the chamber. Preferably the battery is a lead-acid battery and may be any one of a suitable kind of lead-acid battery, including conventional wet-type, calcium-calcium (MF), AGM or gel battery.

In a third aspect, the present invention provides a portable battery box suitable for recharging and housing a battery, the battery box comprising:

a main body for housing a 12 v or 24V battery, the main body including a base wall, a top wall and at least one side wall extending between the base and top walls;

a charging apparatus for charging a 12V or 24V battery;

an inverter; and a general power outlet for AC output to power household devices.

Preferably the main body includes a covering lid which comprises a top wall and a downwardly-depending skirt, the arrangement being such that the downwardly-depending skirt extends to form a hollow lid shell having a rim at an opening of the hollow lid shell to form a lid chamber. Similarly, a hollow base shell is formed, so that a base chamber is provided having a rim, the chamber being adapted to house a battery. The lid and base shells may be roughly equal in size, and preferably the lid shell is about ⅓ the size of the base shell.

When assembled together the rims of the shells are hinged along one wall and at an opposite wall they are fastened together with a clasp to close the main body.

Preferably the battery is removable by opening the covering lid and removing the battery from the chamber in the hollow base shell.

Preferably the inverter is removably mounted in the portable battery box.

In a fourth aspect, the present invention provides a method of monitoring a charging or discharging operation of a battery in use disposed in a portable battery box according to the first, second or third aspects of the present invention, the method including the steps of:

measuring first charging and/or discharging parameters at selected time intervals;

estimating selected other charging parameters at selected time intervals; and displaying the charging or discharging parameters on a display screen associated with the battery box, the charging or discharging parameters being selected from the group consisting of: battery voltage; charging status; time to charge completion; time to discharge completion; condition of the battery; battery charging current; battery discharge current.

The display may be activated by receiving input from a user interface. Preferably the user interface is an information key adapted to be depressed to activate. Preferably the display is activated by a charge input at the external power socket, or when a device is otherwise plugged into one of the electrical access ports.

In a fifth aspect, the present invention provides a data processing apparatus for charging a battery in a portable battery box, the data processing apparatus including:

a central processing unit (CPU);

a memory operatively connected to the CPU, the memory containing a program adapted to be executed by the CPU, wherein the CPU and memory are operatively adapted to receive an input voltage value of a battery in use disposed in the battery box and estimate a battery capacity value associated with the battery and send the capacity value to a display screen for display to a user.

In a sixth aspect, the present invention provides a computer program element comprising a computer program code to make a programmable device:

measure and store a voltage of a battery in use disposed in a portable battery box;

estimate a battery capacity value associated with the battery based on the measured battery voltage; and display the battery capacity value on a display screen.

Preferably the estimate step includes the step of consulting reference maps which contain values of charge capacity corresponding to selected voltage values.

Preferably the estimate step also includes calculating time remaining from an algorithm which utilises the charge capacity from the reference maps.

In a seventh aspect, the present invention provides a computer readable memory encoded with data representing a programmable device comprising:

means for receiving a battery voltage value measured across battery terminals of a battery in use disposed within a portable battery box in accordance with a first, second or third aspect of the present invention;

means for estimating the battery capacity based on the measured voltage value; and means for sending a display signal to a display so as to display the battery capacity.

Preferably the display screen is an LCD display screen.

Preferably the memory is configured to log history of charge and discharge.

Preferably the method includes the step of remembering the type of lead acid battery disposed in the portable battery box for a selected period of time.

In an eighth aspect there is provided a portable battery box suitable for housing and charging a battery, the battery box comprising a main body for housing a lead acid battery, the main body including a base wall, a top wall and at least one side wall extending between the base and top walls; and a plurality of different electrical output ports and a charging apparatus for charging a battery.

In a ninth aspect there is provided a portable battery box suitable for housing and charging a removable battery including a display screen for the purpose of monitoring the charging of the battery.

Throughout this specification, unless the context requires otherwise, the word "comprise", or variations such as "comprises" or "comprising", will be understood to imply the inclusion of a stated element, integer or step, or group of elements, integers or steps, but not the exclusion of any other element, integer or step, or group of elements, integers or steps.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention before the priority date of the invention disclosed in this specification.

In order that the present invention may be more clearly understood, preferred embodiments will be described with reference to the following drawings and examples.

DETAILED DESCRIPTION OF THE PREFERRED EMBODIMENTS

Figure 1:
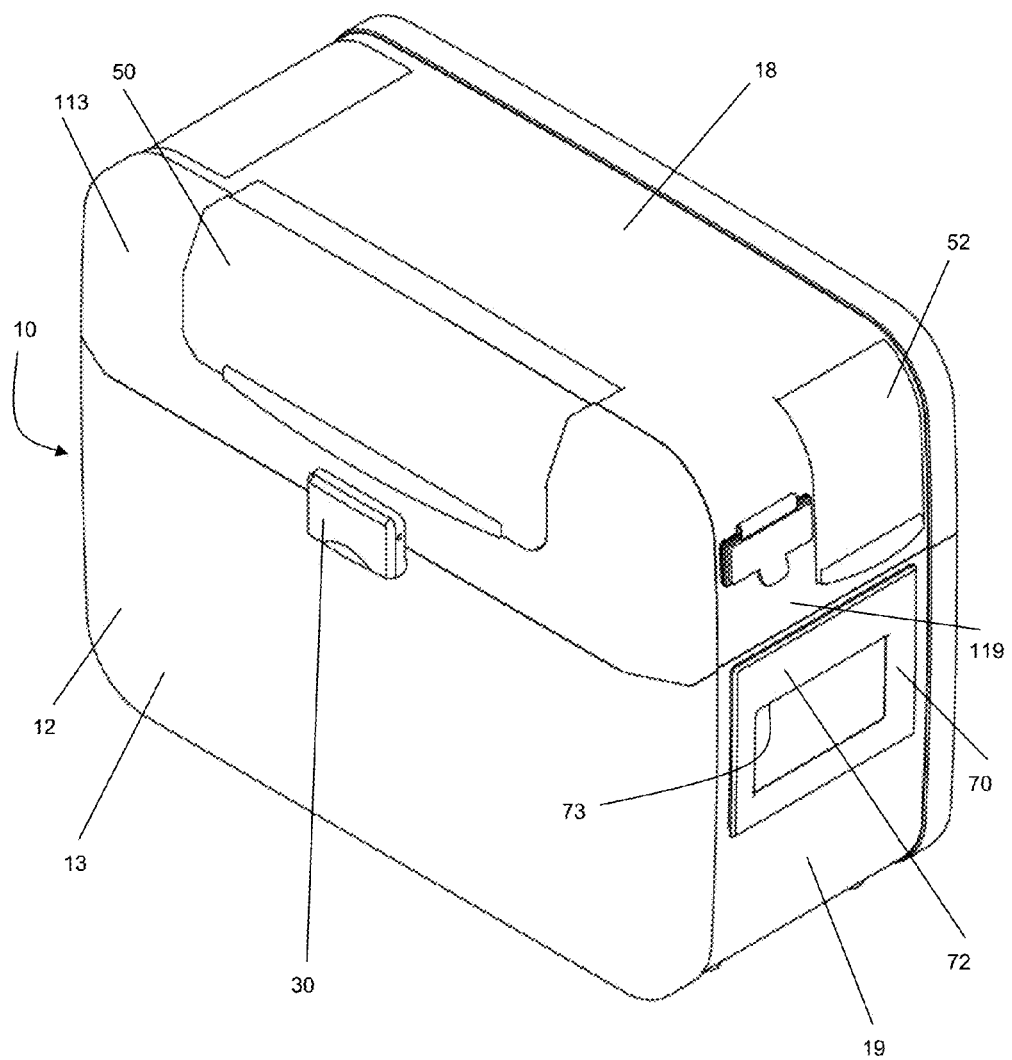
FIG. 1 shows an isometric view of a portable battery box suitable for charging and portably housing a battery in a closed position in accordance with a preferred embodiment of the present invention, showing top, front and right end walls.
Figure 2:
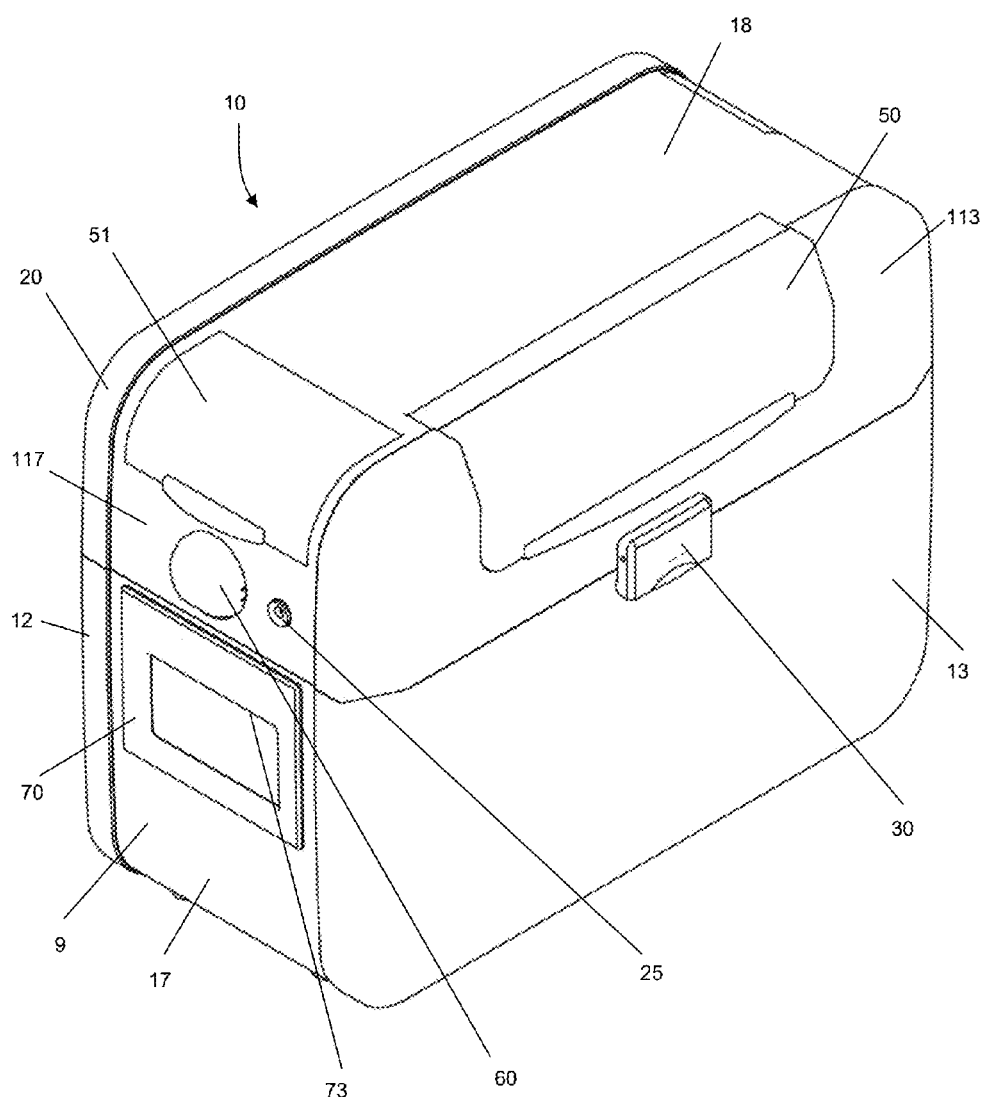
FIG. 2 shows another isometric view of the portable battery box of FIG. 1 in a closed position showing top, front and left end walls.
Figure 3:
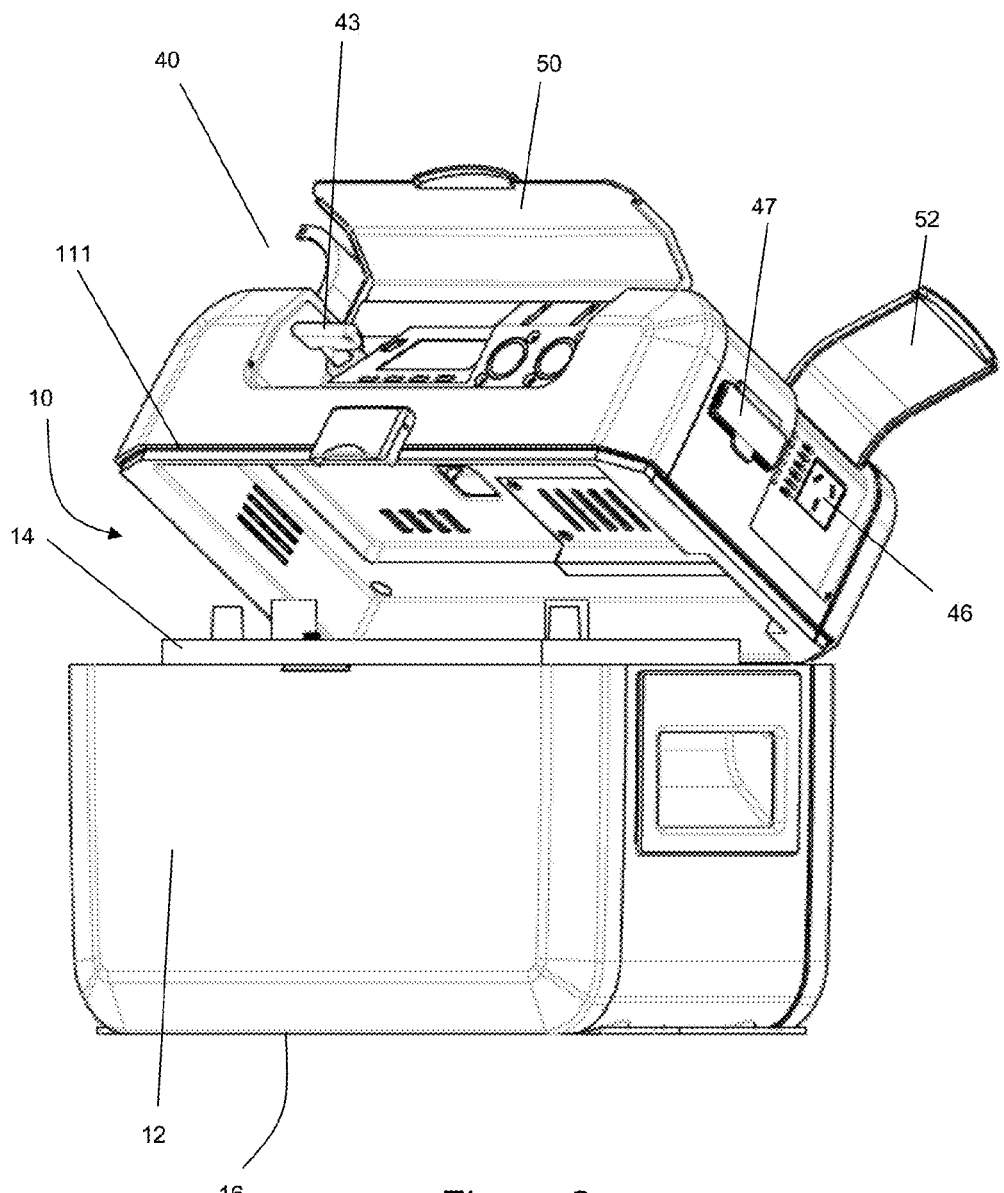
FIG. 3 is an isometric view of the portable battery box of FIG. 1 showing access covers and lid in an opened position.

Referring to the drawings there is shown a portable battery box generally indicated at 10 and suitable for charging and housing a battery 14 when it is disposed within the battery box 10. The portable battery box 10 includes a main body 9 comprising a hollow base shell 12 which itself includes a base wall 16, opposed end walls 17 and 19, and opposed front and back walls 13 and 15, the opposed walls extending from the base wall 16 to a hollow base shell rim 11 which provides an opening 21 through which the battery can be placed so as to be disposed within a hollow chamber 23 for storage within the base shell 12.

The main body 9 includes a covering lid 20 which is in the form of a hollow lid shell 21 and includes a top wall 18 and a skirt depending therefrom, the skirt having opposed end walls 117, 119 and opposed front and back walls 113 and 115. The lid shell is operatively connected to open and close via a hinge on a back of rims 11 and 111. The opposed walls extend towards a lid rim 111 which, when the lid 20 is in a closed position, abuts the hollow base shell rim 11. The lid 20 is adapted to receive and mount control and monitoring electronic devices so as to facilitate their protection from water ingress. The lid shell also includes an interior panel 23 in order to provide structural support and to further cover battery charge and control electronics from water and other fluid ingress thereto.

The main body 9 also includes a fastener in the form of a clasp or latch 30 so as to fasten the hollow base shell rim 11 and the hollow lid rim 111 to one another when the shells are in a closed position. The clasp 30 is disposed along a front wall of the two rims at an intermediate position.

Electrical access ports 40 are provided and are operatively connected to the battery so as to control the charging or discharging of the battery and/or monitor selected parameters of the battery 14 or provide power to or from the battery. The electrical access ports 40 are mounted so as to be disposed adjacent one or more of the top, side, or end walls of the lid shell 21 and are recessed therefrom. In preferred embodiments at least an operational or control or user interface portion of the electrical access ports 40 is recessed from one of the walls. The electrical access ports 40 are mounted so as to be disposed within a recess set in from a wall.

The electrical access ports 40 include an LCD display 41, a plurality of user input keys or a mouse or trackball 42, an isolation switch 43, a plurality of USB slots 44, an external power supply socket 25, a DC cigarette lighter/alternative power source 45, a 240V or 110V AC General Power Outlet (GPO) 46, a 50 A Anderson plug 47 and a pair of DC battery posts (6, 12 or 24V) 48.

The DC battery posts 48 are disposed at a left-hand end of the lid shell 21 to facilitate ease of connection and access.

The LCD Display 41, user input keys 42, cigarette lighter sockets 45 and USB slots 44 are arranged along a front, top wall of the lid shell 21 for ease of user operation.

Figure 4:
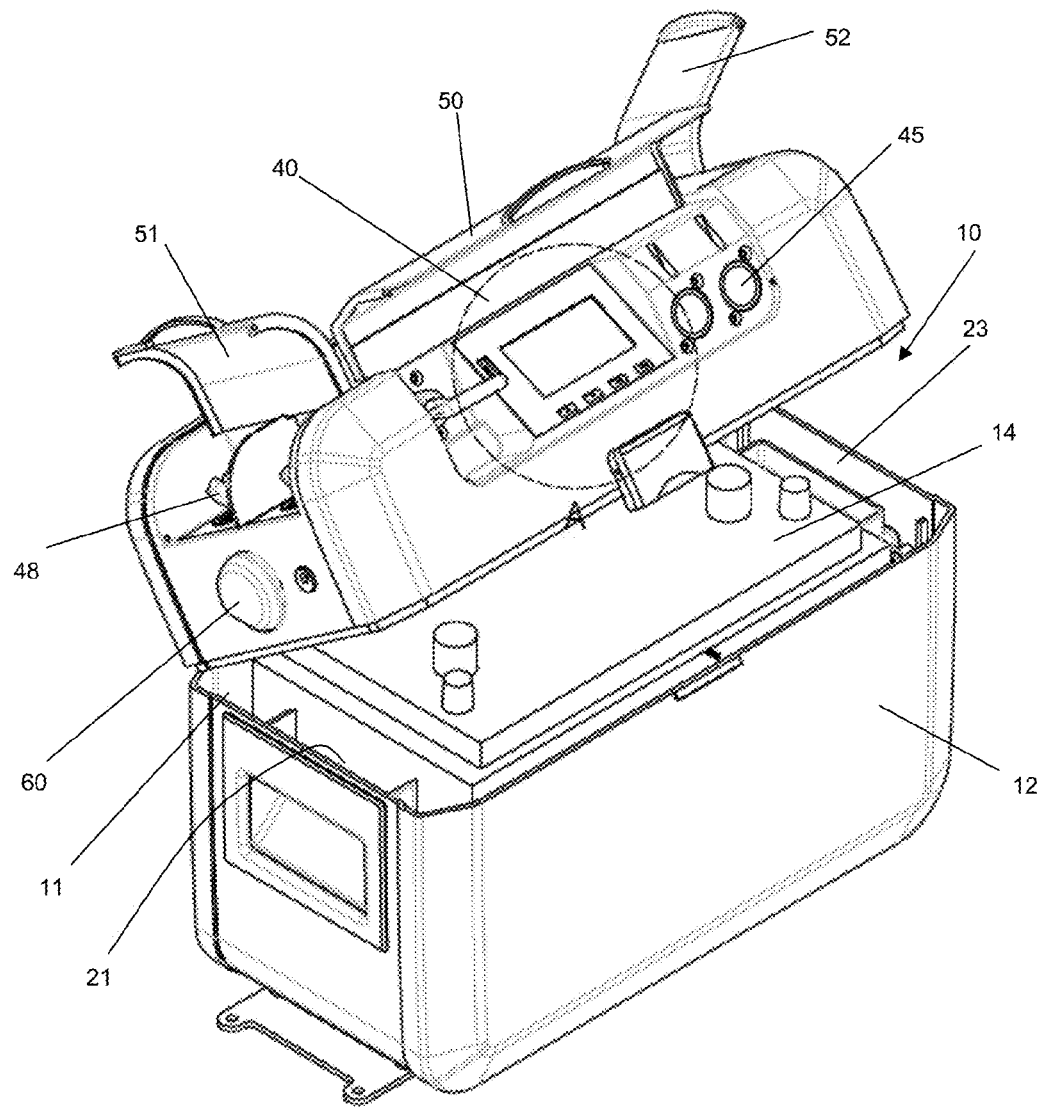
FIG. 4 is another isometric view of the portable battery box of FIG. 1 from a different viewing angle showing the access covers and lid in an open position.
Figure 5:
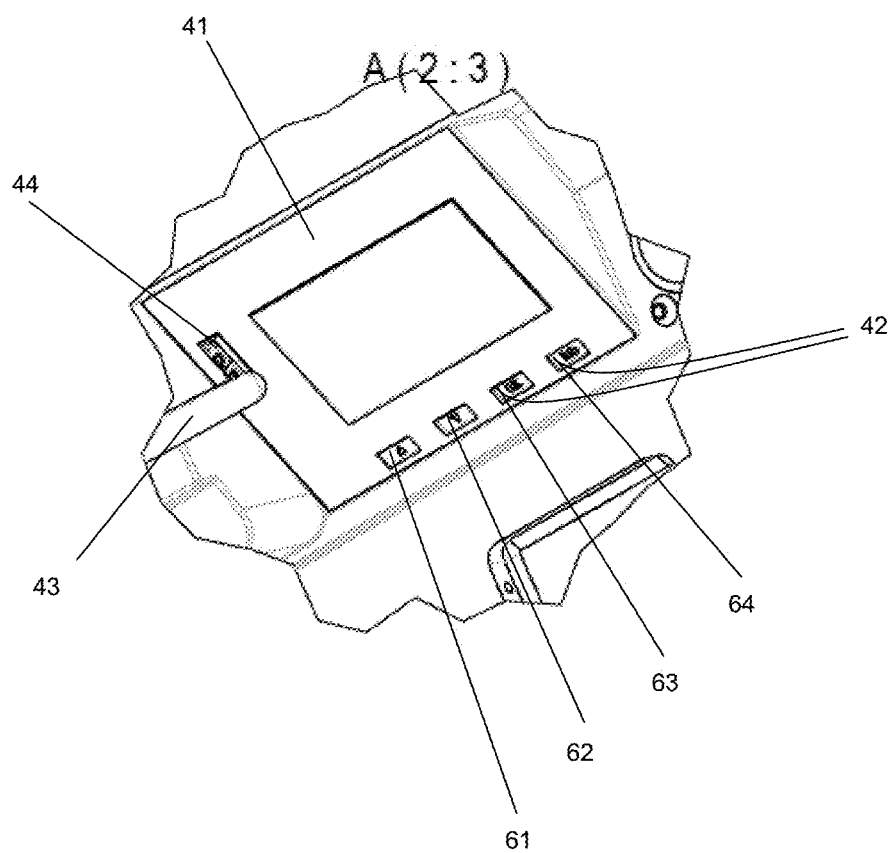
FIG. 5 is a detail view of a user interface and display.
Figure 6:
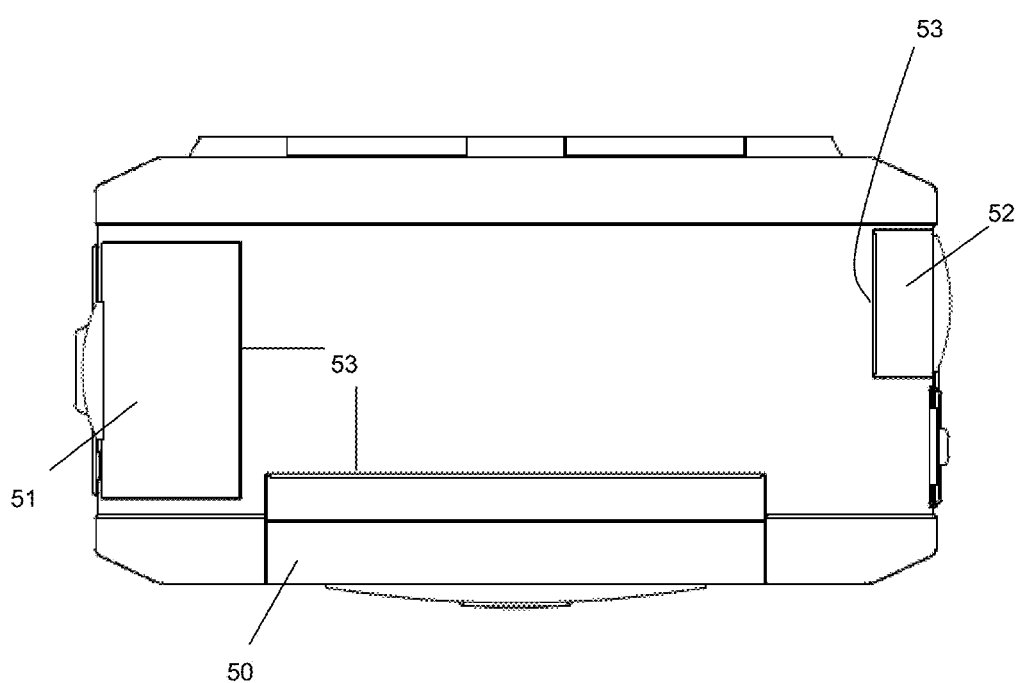
FIG. 6 is a plan view of the portable battery box of FIG. 1.
Figure 7:
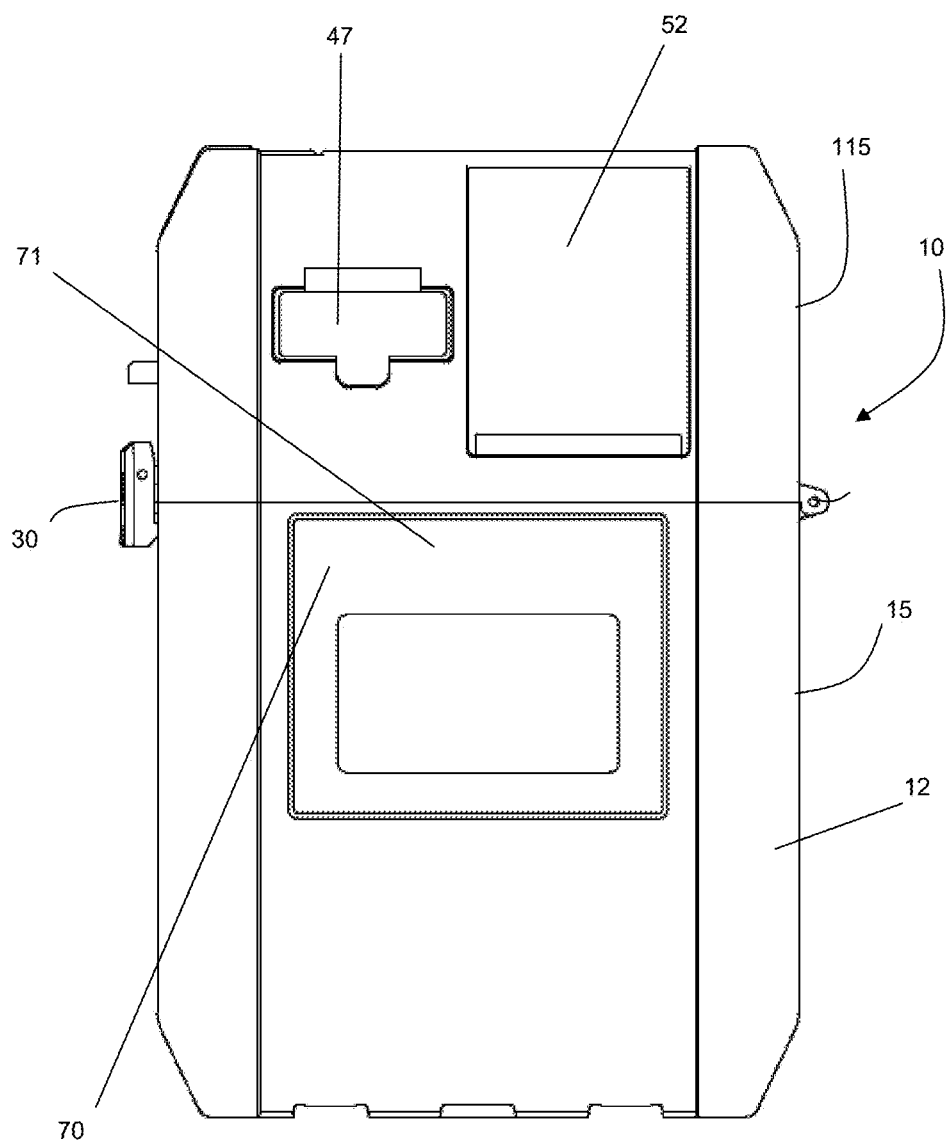
FIG. 7 is a right end elevation view of the portable battery box of FIG. 1.

The hollow lid shell includes access covers 50, 51, 52 in order to cover the electrical access ports 40. The access covers 50, 51, 52 extend from the top wall to an adjacent side or end wall so that each forms a gullwing- or similar other curved shape and are movable from a closed position (shown in at least FIG. 1) to an open position (shown in at least FIG. 4). When the access cover 50 is in the closed position the electrical access ports 40 are substantially sealed and substantially protected from damage and inadvertent operation, for example, when packed in tightly in a boot or trunk of a vehicle with other items. The seal may be disposed on the cover or on the wall which the cover abuts when in the closed position.

When the access cover 50, 51, 52 is in the open position the electrical access ports 40 may be accessed and actuated.

The access covers 50, 51, 52 include hinges 53 and extend from the top wall 18 to a depending wall (113, 115, 117, or 119). The hinges 53 are disposed at the top wall end. A detent is provided to hold the access cover 50, 51, 52 in the open position and the hinges naturally tend to return the access covers to a closed position under the influence of gravity once a user releases them from the detent hold.

The access covers 50, 51, 52 may include a window or may be wholly translucent or transparent for ease of viewing the electrical access ports 40.

The hollow base shell 12 includes handles 70 which are disposed in the walls 17 and 19 of the base shell 12 so that when lifting the battery box 10, the lifting forces are taken substantially in a plane which is substantially parallel to the walls of the hollow base shell and not through the lid shell 21 and clasp 30. The handles 70 are integrated with the wall, in that they are recessed so that at least a face wall portion of the handle 70 is substantially flush with the wall 17 or 19.

The handles 70 include apertures 71 to facilitate cooling air from outside the battery box 12 into the chamber 23 for cooling the battery 14 and the electrical access ports 40. The handles include a surface which cooperates with a finger such that a ramp is provided to guide a finger into a radiused head portion disposed at an upper end of the ramp, the arrangement including a slight overhang. The apertures 71 are is disposed in an upper portion of the radiused overhang so that water may be inhibited from ingress to the chamber 23 through the apertures.

A cooling fan 60 is provided to cool the battery 14 and/or its electrical access ports 40. The cooling fan 60 is mounted in the lid left-hand wall 117. The fan 60 in operation, draws air in from the outside through the handle apertures and out through the lid or the other way around, depending on conditions.

The hollow lid shell 21 and hollow base shell 12 are adapted to be stackable within other lid shells and base shells to reduce volume during transport. The walls of the shells may flare or taper outwards to facilitate stacking.

Further control devices provided include an inverter and a battery charging unit (not shown). The battery charging unit may be powered from a 110 v or 240 v AC power source, a 12 v or 24V DC power source or another suitable power source. The inverter may be removably mounted in the battery box. These devices and the other control devices generally are mounted in the lid portion 20 so as to inhibit water ingress to their componentry and to facilitate access thereto by users.

The battery 14 is removably held in place when disposed in the chamber 23 by a hook and loop strap fastener arrangement which when deployed extends across an upper face of the battery 14.

The portable battery box 10 also includes the charging apparatus which comprises a processing system for charging and conditioning the battery 14. Any suitable form of processing system may be used. For example, the processing system includes at least a processor, a memory, one or more input/output devices, such as for example data ports, other device input port or sensor port, and/or user input buttons 42 and display 41, all coupled together via a bus or other coupling device(s).

Accordingly it will be appreciated that the processing system may be formed from any suitable processing system, such as for example a suitably programmed PC, PCB, PLC, internet terminal, laptop, hand held PC or the like which is typically operating applications software to enable processing, data transfer and in some cases web browsing.

Among other things, the memory stores two reference voltage maps—a first map, being a charging map, and a second map, being a discharging map. The processor is caused by the software to consult these maps from time to time so as to assess the condition of the battery and to display that battery condition during charging and/or discharging on the display 41. Example charge maps are shown in the table below and comprise an array of battery condition percentage values which correspond to selected voltage values. The charge maps thus indicate to the processor the battery capacity level expressed as a percentage, when the processor has received a battery charge value.

| Charge Map | | Discharge Map | |
|---|---|---|---|
| 0% | 10.8 V | 0% | 10.8 V |
| 10% | 11 V | 10% | 11 V |
| 20% | 11.4 V | 20% | 11.2 V |
| 30% | 11.8 V | 30% | 11.4 V |
| 40% | 12.2 V | 40% | 11.6 V |
| 50% | 12.6 V | 50% | 11.8 V |
| 60% | 13 V | 60% | 12 V |
| 70% | 13.2 V | 70% | 12.2 V |
| 80% | 13.4 V | 80% | 12.4 V |
| 90% | 13.6 V | 90% | 12.6 V |
| 100% | 13.8 V | 100% | 12.8 V |

The processor is then caused to display the percentage capacity of the battery. The processor also is caused to calculate the time expected until the battery is fully charged or discharged, from the capacity information and from other data it is able to receive, such as the current draw or current input, (or a net current draw or net current input, if current is being both drawn and input). The algorithm for the calculations is described hereinafter.

Preferably a PCB will be used to process the above information and charge and condition the battery 14.

User input buttons or keys 42 include: Up Button 61; Down Button 62; "OK" Button 63; Information button 64.

Figure 10:
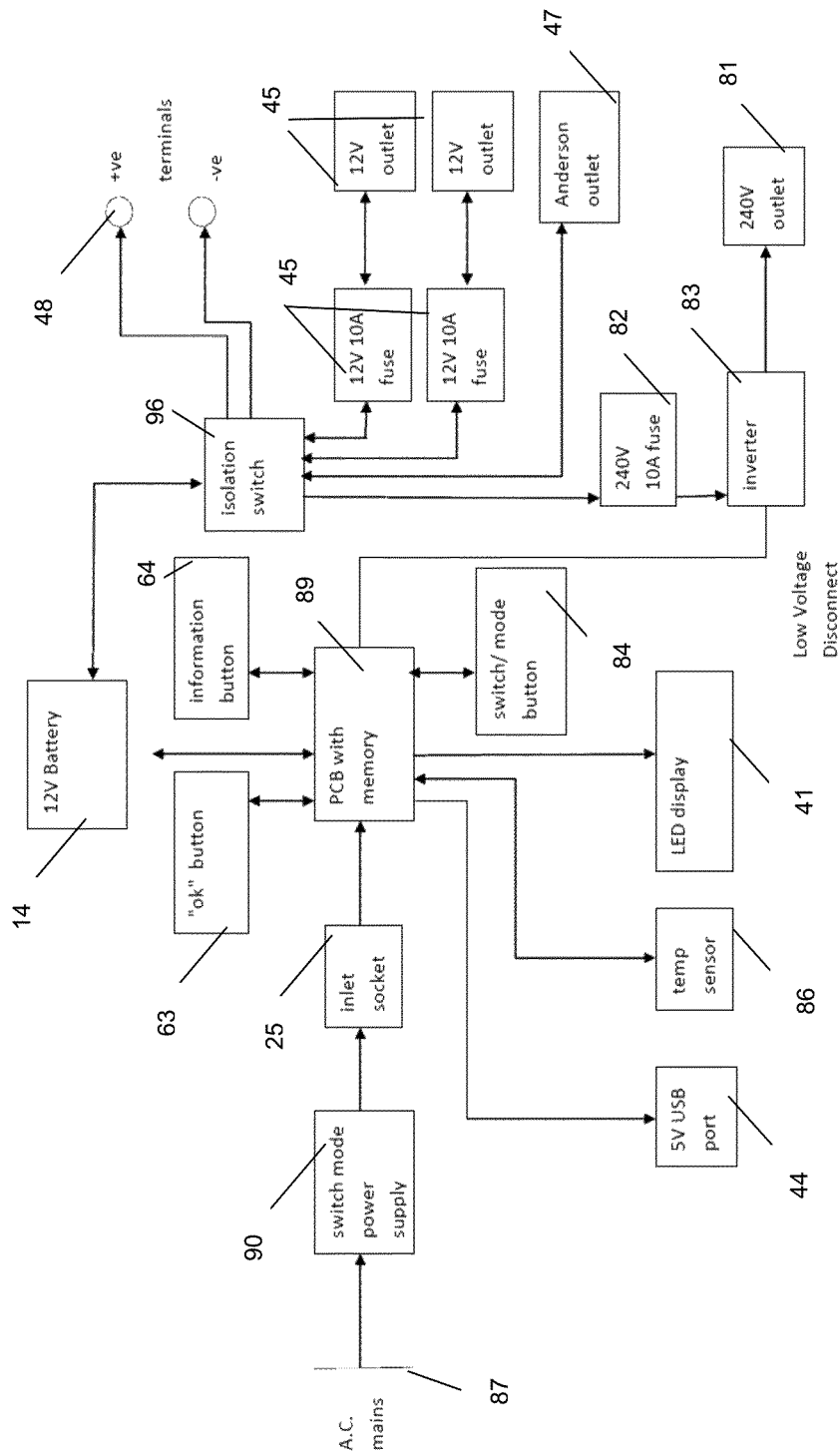
FIG. 10 is a flowchart schematic connection diagram of the charging apparatus of FIG. 1.

Schematic connections are shown in FIG. 10 and which show how the PCB connects with other elements of the battery box. That is, The AC mains are shown at 87 which connect to a switch mode power supply 90 and the external power supply socket 25. The socket 25 is connected to a processor in the form of a PCB 89. The PCB 89 is connected to user interfaces which are in the form of information button 64 and "OK" button 63 and an LCD display 41. A switch/mode button 84 is an input to the processor 89. Outputs from the processor are in the form of USB port 87. Outputs from the battery 14, also connected to the processor 89 are an inverter 83 and 240V power outlet 81, an Anderson outlet 47 through an isolation switch 96, and further 12V cigarette lighter outlets 45.

EXAMPLE

Figure 11:
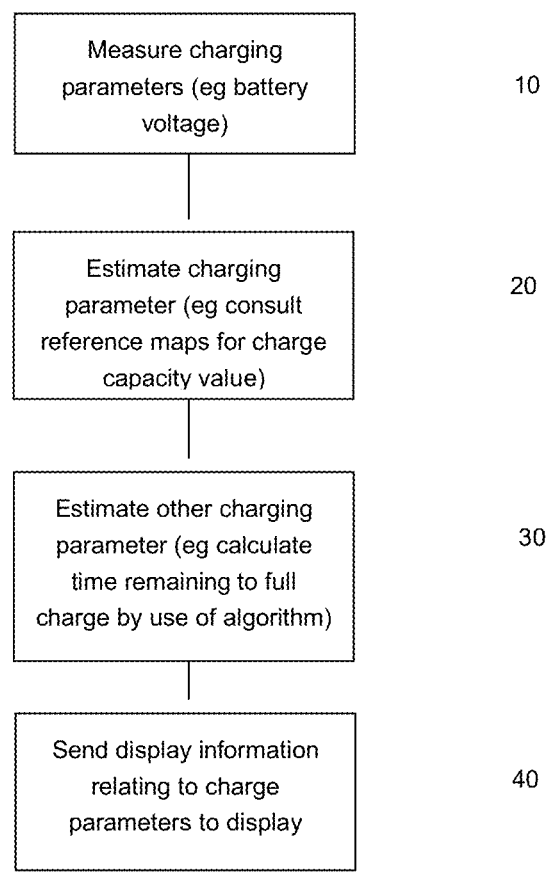
FIG. 11 shows a preferred embodiment of a method of monitoring a battery in a battery box.

In operation the processing system controls the charging and conditioning of the battery and monitors and displays the charge information for users in accordance with the description herein and shown in FIG. 11.

To charge, a plug from an external power supply is inserted into the external power supply socket 25 for charging. The external power supply expects 24V and 6 A DC when in use.

The processor begins in a ready state and waits for charge input from the external power supply socket 25 or a user input key 42.

A sensor in the processing system detects the presence of a charging voltage at the external power socket. The processor may cause the display 41 to read a welcome message: "Welcome to the ARK Smart Powerpack. Please select battery type and press OK" [or similar].

The processor will cause the display to request the input of a battery type, by showing the following message or one like it:

Standard flood-type Lead Acid Battery

Gel Battery

Calcium Battery

AGM Battery

The processor waits until the user has toggled through the above list of battery types using the up/down buttons 61/62 until the selected battery type is highlighted and then waits for the user to press OK to confirm the battery type.

The processor then requests that the battery size (in terms of Ah) is then input by the user or selected from a list which is caused to be displayed on the display 41. This quantity may then be used in a calculation by the software to assess battery charge remaining as described herein.

For example, if Gel battery is selected, the processor will cause the display to read: "Gel Battery selected. Charging commenced" [or similar].

The processor then causes the charging apparatus to commence a selected specific charging program for that battery type by introducing a selected amount of charge from the external power supply socket 25 to the battery terminals in a selected manner in accordance with a selected charging cycle programmed into the processing system. The charging programs are described below.

Figure 8:
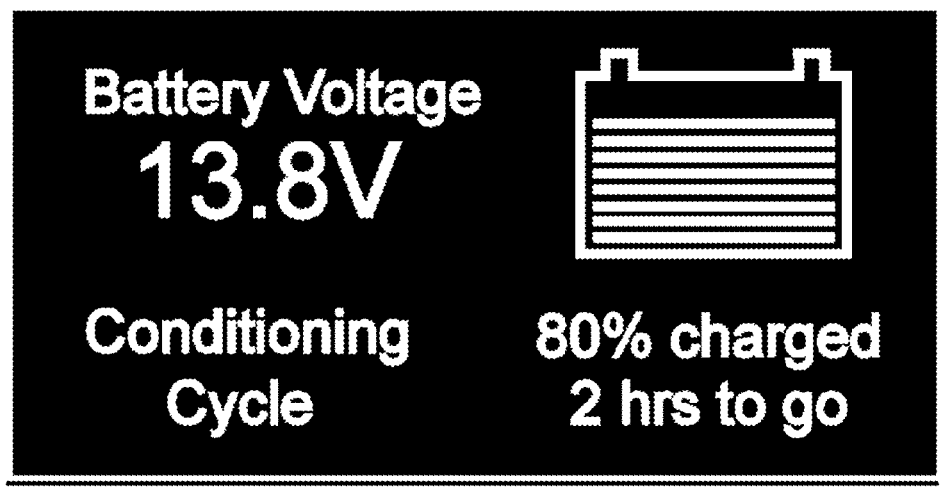
FIG. 8 is a view of the display of FIG. 5 showing a charging display message.

During charging the processor will cause the screen to display the message on display 41 shown in FIG. 8. The processor is caused to update the display 41 after a selected time period has elapsed, which in preferred embodiments is every 15 minutes.

The message caused to be displayed on the display 41 changes depending on the selected charging cycle which as discussed above depends on the type of battery selected.

Charging

If a plug is inserted into the external power supply socket 25 the software will recognize that it should switch to charging mode, and will select one appropriate charging cycle, so as to function as set out below. The processor will measure and receive the battery voltage and then will be caused to select from a charge, conditioning or Bulk charging cycle accordingly, as is known to a person skilled in the art.

During charging the processing system causes the display 41 to display up to four qualities during charging—selected from, among other things, charging current (expressed in Amperes), discharge current (expressed in Amperes), cycle type, battery condition, voltage, and time remaining to full charge or full discharge.

For example, during a Charge Cycle, which is until the battery reaches 12.5V, the following qualities are caused to be displayed:
 (a) Charge Cycle
 (b) Battery condition expressed as a percentage of full (minor units in 1% increments)
 (c) Battery Voltage expressed in units of Volts. (minor units in 0.1V increments) and
 (d) Number of hours to full charge or discharge expressed in hours The information button is the same as the on/off button—holding it down for an extended time will actuate the system, while touching the information button briefly will force a test.

Note: Hours are expressed in 0.5 hr increments

During Charge cycle, if battery does not reach 12.5 voltage after 25 hours the processor will cause the display to read a message such as for example "Alarm. Faulty battery."

During a Boosting cycle wherein the processor maintains a constant voltage to the battery terminals for a period of 5 hours the processor causes the display 41 to display the following properties:
 (a) Boosting Cycle
 (b) Battery condition expressed as a percentage of fully charged
 (c) Battery Voltage expressed in volts
 (d) number of hours to go before fully charged If battery fails to reach approximately 12.5V after 25 hours the processor will cause the display to read an alert message such as for example "Alarm. Faulty Battery" and then will cause the charger to commence a charging cycle known as a Conditioning cycle.

During a Conditioning cycle wherein the processor causes the battery to charge by maintaining constant voltage to the battery terminals at a current of approx 0.1 A the processor causes the display to display the following qualities:
 (a) Conditioning (float) Cycle
 (b) Battery condition expressed as a percentage of fully charged
 (c) Battery Voltage expressed in Volts Note: this cycle will maintain the constant battery voltage for 500 hours Testing During charging, the processor is caused by the software, at selected time intervals, preferably 15 minutes, to stop charging the battery and rest the battery for a rest period. The rest period is for approximately 20 seconds. The processor, at the end of the 20-second rest period, is caused to detect the voltage across the terminals of the battery 14. The processor is then caused to compare that measured voltage value to a reference voltage stored in the charging map. The reference voltage corresponds with a figure on the charging map which is a percentage charge in the battery and the processor is caused to display that percentage charge on the display 41.

The processor is caused to select the charge map based on a net current flow value. That is, the processor is caused to measure the current flow in through the external power socket and the current flow out through the other ports or battery outlet, and makes a decision as to which charging map to consult, based on the net current flow.

The charging map and the discharging map are different to reflect that the battery capacities under charge differ under charge and discharge so this distinction is preferred to be made so the calculation is more accurate. For example, a battery with 90% charge might correspond to 12.6V under discharge conditions but a battery with 90% charge might correspond to 13.6V under charge conditions. Differing batteries have different charge maps.

The time until full charge is calculated using the quantities of:
a) battery capacity value from the reference map
b) the total battery capacity when full
c) current flow in
in accordance with the equation below:

$$(a)\ Timeremaining(\text{hrs}) = \left(\frac{\%\ charge \times Ahcapacity}{Currentnow}\right)$$

That is:
Timeremaining=number of hours remaining until full discharge or charge
% charge=battery capacity remaining, taken from charge map
Ahcapacity=battery capacity when full, expressed in Ampere hours
Currentnow=net current to the battery ie charge current−strap current (flowing from the battery).

A similar equation is utilised for calculating time to discharge.

In between the 15-minute scheduled tests, the software receives current flow (Ampere) information at more frequent intervals from ammeters disposed to measure input current and output current and updates the display to display charge remaining percentage estimate figures.

Discharging

Figure 9:
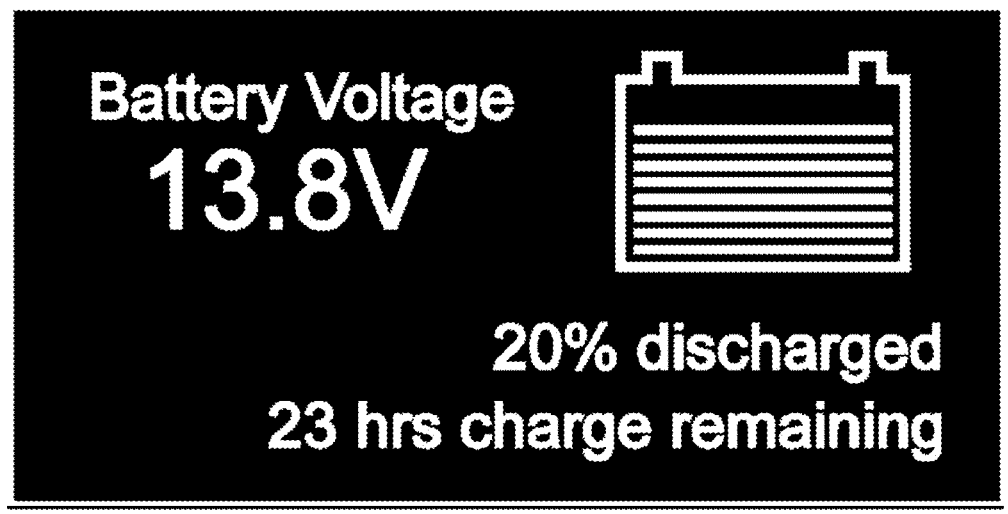
FIG. 9 is a view of the display of FIG. 5 showing a discharging display message.

Default mode for the charging processor system is discharge mode. When power is detected at the external power supply socket 25, the unit will commence charging, however, if there is a net outflow of charge, the display may show a time to discharge. That is, during net discharging the processor will recognize that the battery is in net discharging mode and will display a discharge message on the display 41 which is shown on FIG. 9.

Also, when the information button is pressed during discharging i.e. an appliance is connected though one of the outlets, such as the USB port, or GPO or Anderson port or DC battery posts, the processor will cause the display 41 to show:
(a) battery condition expressed as a percentage of fully charged
(b) Battery Voltage expressed in volts
(c) Number of hours at the present discharge rate remaining before the battery is fully discharged.

Unlike charging, the 15 minute rest stops are not caused to occur in net discharge mode. The processor is caused to constantly monitor (continuously, or every few seconds or milliseconds) the battery charge across the terminals while the battery 14 is discharging. The battery voltage measurement is compared with the discharge reference map.

A thermocouple is provided and connected to the processing apparatus. If the internal temperature of the box exceeds a selected temperature the processor will cause the display to read "warning—overtemperature" [or similar] and to sound a buzzer.

If the wires are connected to the wrong terminals the screen will read "wires connected to wrong battery terminals, reverse polarity to commence charging". A buzzer sounds a warning.

The processing apparatus stores the selected battery type in its memory until battery is disconnected so that that information does not have to be input again by a user unless other circumstances dictate its input again.

Charging and Discharging

A useful feature of preferred embodiments of the present invention is that the software and processor can calculate and cause the display to display the net charging rate or net discharging rate of the battery 14 if the battery is being charged and discharged simultaneously. That is, if, say, a light or a radio is being used, say, by being plugged into the GPO, and the battery is being charged at the same time, by use of the external power supply socket 25, then the net charging or discharging rate is calculated by the processor and then displayed on the display 41. The software decides in this case to use an appropriate charge map depending on the net charge or discharge rate. Depending on the net charge or discharge rate, there may be a rest period as described hereinabove during which the battery voltage is measured so as to assist with capacity calculations.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

We claim:

1. A portable power supply comprising:
a housing for receiving a lead-acid battery for removable mounting therein, the housing comprising spaced-apart walls, an open top and an access cover for closing the open top and providing access to the removable lead-acid battery;
a computing processor in electrical communication with the removable lead-acid battery for processing information about the removable lead-acid battery mounted in the housing;
a powered display panel disposed on the housing in electrical communication with the computing processor for displaying messages or images thereon relating to the lead-acid battery, and the messages or images displayed include any of: battery charge percentage, time remaining to discharge completion, and battery capacity in Ampere hours; and
a plurality of power sockets mounted on the housing for providing power to electrical devices.

2. The portable power supply in accordance with claim 1 further comprising an inverter system for providing alternating current from the battery, the inverter electrically connected to at least one of the power sockets.

3. The portable power supply in accordance with claim 1 wherein the selected walls are end walls, and wherein the handles are recessed in end walls of the housing.

4. The portable power supply in accordance with claim 1 wherein the handles include apertures to facilitate ingress of cooling air from outside the housing into the housing for cooling the removable battery.

5. The portable power supply in accordance with claim 1 wherein the handles include a surface which cooperates with a finger such that a ramp is provided to guide a finger into a radiused head portion disposed at an upper end of the ramp.

6. The portable power supply in accordance with claim 1 further comprising a user input device including one or more user input buttons for selecting the type of battery based on its construction disposed within the housing, the display screen electrically connected to the user input buttons displaying differing messages or images depending on selection of the battery type.

7. The portable power supply in accordance with claim 6 wherein the user input device is configured to receive a user selection of battery capacity in Ampere hours.

8. The portable power supply in accordance with claim 6 wherein the computing processor is configured to receive input, from the user input device, a measure of battery capacity in Ampere hours.

9. The portable power supply in accordance with claim 8 wherein the computing processor is configured to estimate the time remaining to full discharge of the removable battery.

10. The portable power supply in accordance with claim 6 wherein the user input device is configured to select data regarding the construction type of battery from the group consisting of: standard lead-acid, calcium, AGM, and gel for input into the computing processor.

11. The portable power supply in accordance with claim 1 wherein at least one of the power sockets is a USB port for supplying power to an electronic device.

12. The portable power supply in accordance with claim 1 further comprising a DC-to-AC inverter and a 240V/50 Hz or 110V/60 Hz General Power Outlet for supplying power to an electrical device.

13. The portable power supply in accordance with claim 12 wherein the DC-to-AC inverter is removably mounted in the housing.

14. The portable power supply in accordance with claim 12 wherein the or each General Power Outlet is mounted on one or more of the walls or lid so that they are recessed therefrom; and one or more access covers is provided, each access cover for covering a general power outlet so that by actuating the or each access cover the general power outlet may be accessed and wherein the cover is generally flush with its respective wall.

15. The portable power supply in accordance with claim 14 wherein the or each access cover extends over a portion of the top wall to a portion of an adjacent side wall so that the or each access cover is in the form of a gullwing-like shell.

16. The portable power supply in accordance with claim 1 wherein the computing processor is configured to consult relevant voltage maps stored in a storage portion of the computer processor which contains certain values of battery charge percentage corresponding to certain voltage values of the selected battery type.

17. The portable power supply in accordance with claim 1 further including a temperature sensor associated with the housing, and wherein the computing processor is configured to receive input from the temperature sensor to assess the measured temperature against a cutout temperature, so as to inhibit discharging if the measured temperature exceeds the cutout temperature.

18. The portable power supply in accordance with claim 1 further comprising a charging apparatus having a processing system for charging the removable battery.

* * * * *